(12) United States Patent
Chida

(10) Patent No.: US 6,954,475 B2
(45) Date of Patent: Oct. 11, 2005

(54) SEMICONDUCTOR LASER DEVICE

(75) Inventor: Atsushi Chida, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 357 days.

(21) Appl. No.: 10/215,184

(22) Filed: Aug. 9, 2002

(65) Prior Publication Data

US 2003/0039283 A1 Feb. 27, 2003

(30) Foreign Application Priority Data

Aug. 10, 2001 (JP) ........................................ 2001-243871

(51) Int. Cl.$^7$ ................................................ H01S 3/04
(52) U.S. Cl. ........................................ 372/36; 372/109
(58) Field of Search .......................... 372/38, 108, 43, 372/32, 109, 31, 101, 50, 45, 96, 36; 260/214

(56) References Cited

U.S. PATENT DOCUMENTS

| | | | | |
|---|---|---|---|---|
| 4,942,584 A | * | 7/1990 | Karaki et al. ................... 372/9 |
| 5,838,703 A | * | 11/1998 | Lebby et al. ................ 372/43 |
| 5,974,066 A | * | 10/1999 | Wu et al. ..................... 372/43 |
| 6,410,904 B1 | * | 6/2002 | Ito et al. ................. 250/214 R |
| 2002/0044589 A1 | * | 4/2002 | Terashima et al. .......... 372/108 |
| 2002/0075915 A1 | * | 6/2002 | Yagi ............................ 372/36 |

FOREIGN PATENT DOCUMENTS

| | | | | |
|---|---|---|---|---|
| JP | 7142813 | * | 6/1995 | ............. H01S/3/18 |
| JP | 7170024 | * | 7/1995 | ............. H01S/3/18 |
| JP | 1125465 | | 1/1999 | |

* cited by examiner

Primary Examiner—Minsun Oh Harvey
Assistant Examiner—Tuan N. Nguyen
(74) Attorney, Agent, or Firm—Morrison & Foerster LLP

(57) ABSTRACT

There is provided a semiconductor laser device capable of maintaining a good luminous characteristic under severe environment. A cap 4 in an approximate portal shape having lateral apertures 41 is attached to a stem 1 on which a laser diode 2 and a light receiving element 3 are mounted. A holographic element 5 is mounted on a window 43 of the cap 4. Air inside the cap 4 is exchanged with outside air through the lateral apertures 41 to effectively cool the laser diode 2, thus enabling the semiconductor laser device to maintain a good luminous characteristic under high-temperature severe environment.

5 Claims, 5 Drawing Sheets

TEMPERATURE CHANGE OF
SEMICONDUCTOR LASER DEVICE

SEMICONDUCTOR LASER DEVICE

BACKGROUND OF THE INVENTION

The present invention relates to a semiconductor laser device.

Conventionally, there have been semiconductor laser devices to be incorporated in pickup units of information recording and reproducing apparatuses for personal computers as shown in FIG. 7. Such semiconductor laser device includes a stem 101 having a laser diode 102 and a light receiving element 103 mounted thereon, a protect cap 104 welded or bonded to the stem 101 for protecting the laser diode 102 and the light receiving element 103, and a holographic element 105 mounted on the protect cap 104. The protect cap 104 has a structure without an aperture for sealingly enclosing the laser diode 102 and the light receiving element 103 so that the laser diode 102 and the like is not affected by dust or foreign substances from the outside.

Recently, the pickup units have been commonly and widely applied to CD (Compact Disk) players for automobile use and to car navigation systems using CD-ROM (Compact Disk Read Only Memory) or DVD-ROM (Digital Versatile Disk Read Only Memory), as well as to the information recording and reproducing apparatuses for personal computers. The pickup units for use in vehicle are exposed to severer environment, especially in summer time when the temperature is raised, than the environment of the pickup units in use for personal computers installed inside of the room. The conventional semiconductor laser device has a laser diode 102 disposed inside the protect cap 104 without an aperture, which prevents radiation of heat from the laser diode especially under the severe environment. Eventually, the temperature of the semiconductor laser device is raised, which causes a problem that deterioration of luminous efficiency and change of emission wavelength may easily occur.

SUMMARY OF THE INVENTION

Accordingly, it is an object of the present invention to provide a semiconductor laser device capable of maintaining a good luminous characteristic under severe environment.

In order to accomplish the above object, there is provided a semiconductor laser device having a stem on which at least a laser diode is mounted, comprising:

a cap which has an approximate portal shape having opposed lateral apertures, and is welded or bonded to the stem; and a holographic element mounted on the cap.

According to the above constitution, via the opposed lateral apertures of the cap welded or bonded to the stem, air inside the cap is exchanged with air outside the cap. The air effectively cools the laser diode inside the cap. Therefore, the semiconductor laser device is effectively cooled, thereby securing stable operation even if it is incorporated, for example, in CD players for automobile use and in navigation systems using DVD-ROM, and used under severe high-temperature in-vehicle environment.

Also the cap is in an approximate portal shape, which facilitates manufacturing, thereby improving productivity of the semiconductor laser device.

In one embodiment, a reinforcing plate portion is provided on an upper side of each of the lateral apertures of the cap.

According to the above embodiment, the semiconductor laser device has a reinforcing plate portion on the upper side of each of the lateral apertures of the cap, which imparts relatively large strength to the cap. Consequently, even if the semiconductor laser device is used for example in the car navigation system using DVD-ROM and operates under the environment receiving vibration and impact, an excessive displacement will not be generated between the holographic element mounted on the cap and the laser diode mounted on the stem. Therefore, the semiconductor laser device stably emits a laser beam even under the environment receiving vibration and impact.

In one embodiment, the cap is attached to the stem so that the lateral apertures face both end sides of longer side direction of the stem.

According to the above embodiment, in the semiconductor laser device, the cap is attached to the stem so that the lateral apertures of the cap face both end sides of longer side direction of the stem, which makes lateral portions of the cap without apertures face lateral sides of shorter side direction of the stem. This lateral portion effectively protects invasion of foreign substances into the cap from the outside thereof, ensuring effective protection of a laser diode and a wire inside the cap.

In one embodiment, the stem has arched protruding ridge portions on both ends of longer side direction thereof, the cap has flange portions on a lower end thereof, and the flange portions of the cap are welded or bonded to the ridge portions of the stem.

According to the above embodiment, in the semiconductor laser device, the flange portions of the cap are welded or bonded to the arched ridge portion of the stem, thus facilitating manufacturing thereof.

In the semiconductor laser device in one embodiment, the stem has flat portions which are disposed on both end portions of shorter side direction thereof and which extend to longer side direction thereof;

the cap has the lateral apertures and the reinforcing plate portions on both end portions of longer side direction thereof and has lateral plate portions on both end portions of shorter side direction thereof; wherein the lateral plate portions of the cap are welded or bonded to the flat portions of the stem.

According to the embodiment, the lateral plate portions of the cap are welded or bonded to the flat portion of the stem, so that the lateral apertures and the reinforcing plate portions of the cap are disposed on the position corresponding to the both ends of longer side direction of the stem. Therefore, the both ends of the longer side direction of the stem and the end face facing the cap side are free from, for example, the flange of the cap, and therefore the end face of the stem has relatively large free area. While the end face of the stem having relatively large free area is brought into contact with a support portion of a pickup unit, the semiconductor laser device is moved against the supporting portion, which enables highly accurate and easy positioning of the semiconductor laser device against the pickup unit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention will be described in detail in conjunction with embodiments with reference to the drawings.

Figure 1:
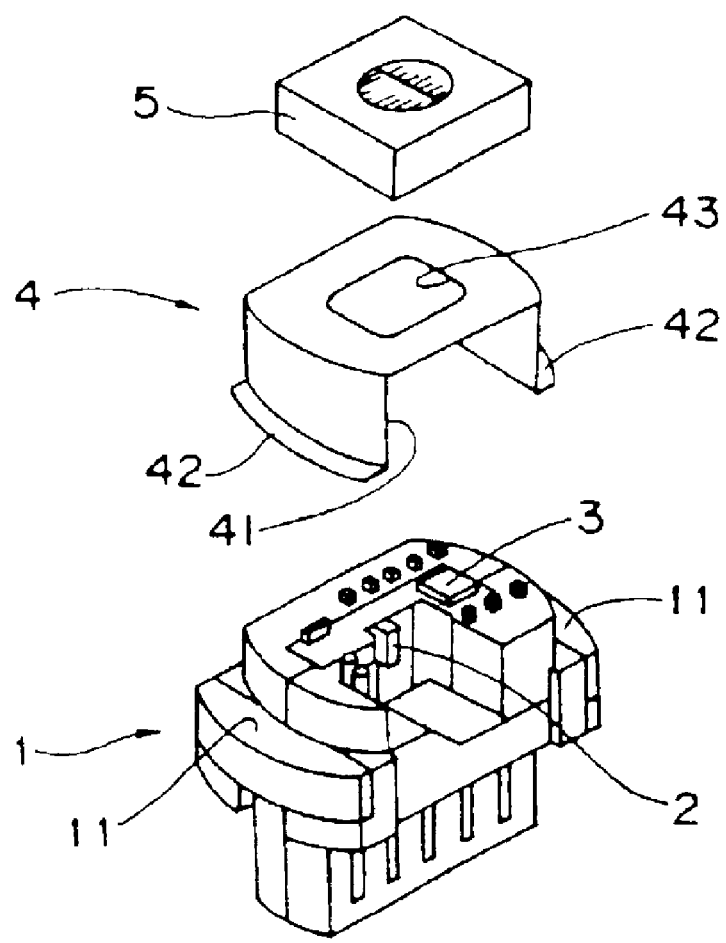
FIG. 1 is an exploded perspective view showing a semiconductor laser device of an embodiment of the present invention.

FIG. 1 is an exploded perspective view showing a semiconductor laser device in an embodiment of the present invention. The semiconductor laser device has a stem 1 composed of a metal portion mainly made of iron and a resin portion, and the stem 1 has metallic lead pins to be electrically connected to a component mounted on the stem 1 and external wiring terminals to be connected to the lead pins and external wirings. A laser diode 2 and a light receiving element 3 are mounted on the stem 1, and the laser diode 2 and light receiving element 3 are electrically connected to the lead pins through an unshown wire. It is noted that a monitor diode (unshown) for optical output adjustment is usually disposed between the laser diode 2 and the stem 1. The stem 1 has arched protruding ridge portions 11, 11 on the both ends of longer side direction.

On the stem 1, there is mounted a cap 4 in an approximate portal shape having lateral apertures 41, 41 facing to each other on lateral face sides of longer side direction. The cap 4 has flange portions 42, 42 on the lower end of the lateral face portions on the both ends of longer side direction. The flange portions 42, 42 are welded to the ridge portions 11, 11 for mounting the cap 4 on the stem 1. The cap 4 mounted on the stem 1 exchanges air in the cap 4 with air outside the cap 4 through the lateral aperture 41.

On the upper face of the cap 4, there is formed a window 43. A holographic element 5 is mounted on the cap 4 so as to cover the window 43. When the holographic element 5 is mounted on the cap 4, a light beam is emitted from the laser diode 2, and on an optical axis thereof, the center of a holographic pattern of the holographic element 5 is positioned, while at the same time, the light beam from the laser diode 2 is reflected by a reflector (not shown) equivalent to an optical disk, which is disposed above the holographic element 5, and the reflected light is received by the light receiving element 3. The position of the holographic element 5 on the cap 4 is adjusted such that the received light signal from the light receiving element 3 is measured.

Figure 2:
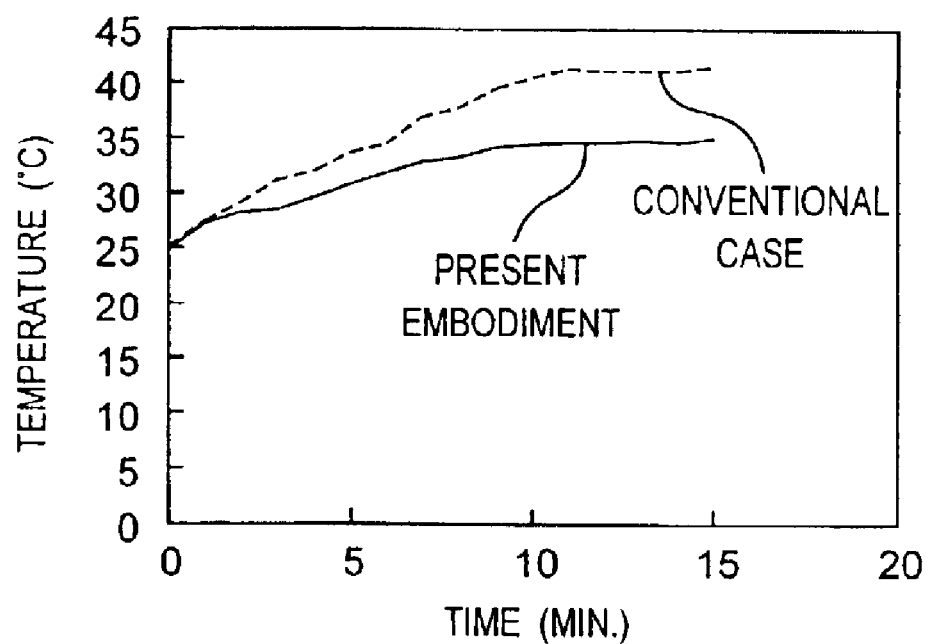
FIG. 2 is a view showing temperature rise after startup of the semiconductor laser device of the embodiment and temperature rise after startup of a conventional semiconductor laser device together in chronological order.
Figure 7:
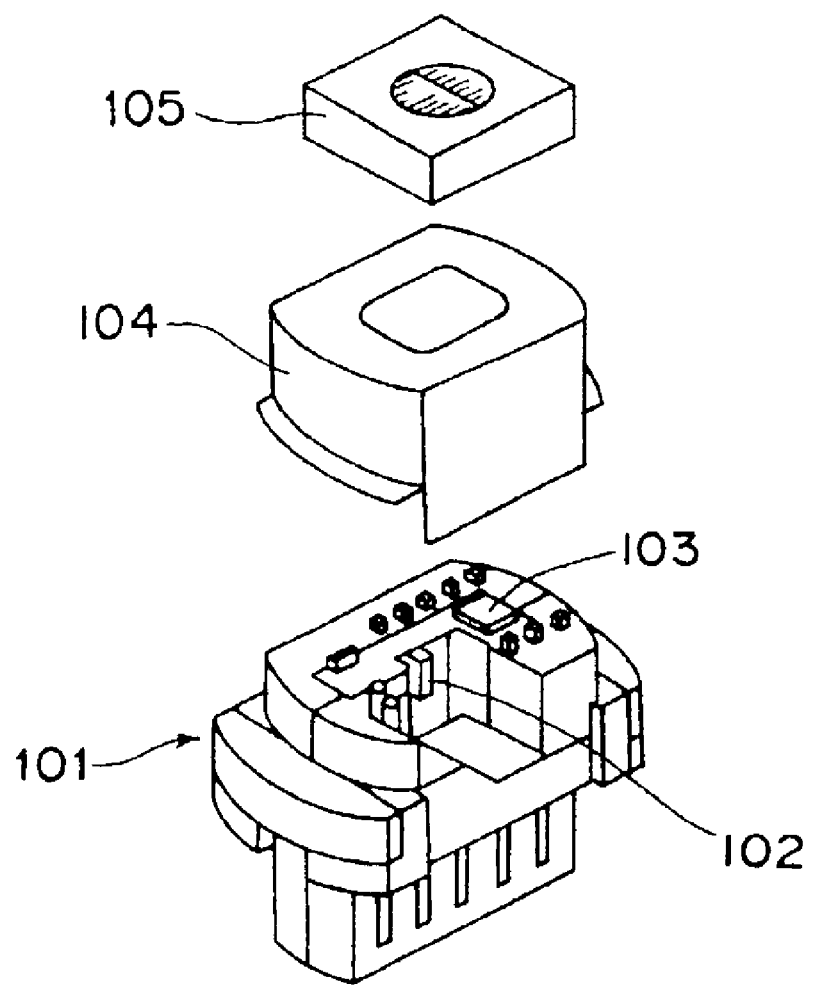
FIG. 7 is an exploded perspective view showing a conventional semiconductor laser device.

FIG. 2 is a view showing together a temperature change when the semiconductor laser device of the above embodiment is operated and a temperature change when a conventional semiconductor laser device of FIG. 7 is operated. There are shown temperatures of semiconductor laser devices risen from a temperature of 25° C. by emitting 3 mW laser beams from the holographic elements 5, 105 in chronological order. The temperature change of the semiconductor laser device of the present embodiment is expressed by a solid line, whereas the temperature change of the conventional semiconductor laser device is expressed by a broken line. As shown in FIG. 2, both the semiconductor laser device of the present embodiment and the conventional semiconductor laser device show the temperature stabilized approx. 10 minutes after temperature rise due to start of light emittance from the laser diode. The stabilized temperature is over 40° C. in the case of the conventional semiconductor laser device, whereas in the case of the semiconductor laser device of the present embodiment, it is around 35° C., which is lower by approx. 5° C. than the temperature of the conventional semiconductor laser device. This is because the semiconductor laser device of the present embodiment exchanges air inside the cap 4 with air outside the cap 4 via the lateral apertures 41 of the cap 4, and the exchanged air helps effective delivery of heat from the laser diode 2.

In the semiconductor laser device of the present embodiment, temperature rise after start of operation is smaller than that of the conventional device. Consequently, if used under high-temperature environment such as DVD-ROM reproducing apparatuses for automobile use, the semiconductor laser device reaches a temperature lower than that of the conventional device, which decreases occurring of such problem as deterioration of luminous efficiency and change of wavelength of emission light.

The cap 4 of the semiconductor laser device of the present embodiment is in an approximate portal shape, which facilitates manufacturing, thereby improving productivity of the semiconductor laser device.

Figure 3:
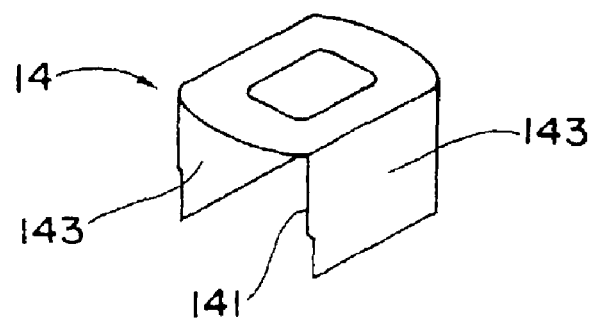
FIG. 3 is a perspective view showing a cap of the semiconductor laser device of FIG. 1.

FIG. 3 is a view showing a cap in another embodiment. Since the configuration of this embodiment is identical to the embodiment shown in FIG. 1 except the configuration of the cap, description will be made with reference to FIG. 1 as a substitution. The cap 14 has lateral apertures 141, 141 on the both end portions of longer side direction. The lateral apertures 141, 141 are positioned so as to face the both end sides of shorter side direction of the stem 1, and lateral portions 143, 143 of the cap are welded to the both lateral faces of shorter side direction of the stem 1.

When the semiconductor laser device of the present embodiment is operated, heat generated by the laser diode is dispersed to the outside of the semiconductor laser device via air exchanged between the inside and the outside of the semiconductor laser device through space between the lateral apertures 141 and the stem 1. Eventually, if operated under high-temperature environment, the semiconductor laser device reaches a temperature lower than that of the conventional device. Therefore, luminous efficiency of the semiconductor laser device of the present embodiment may be improved compared to the conventional semiconductor laser device even under severe environment.

Further, the cap 14 is positioned so that the lateral apertures 141, 141 face the both end sides of longer side direction, and the lateral portions 143, 143 of the cap 14 are welded to the both lateral faces of shorter side direction of the stem 1, which may effectively prevent foreign substances from the outside from coming into contact with a wire adjacent to the both sides of longer side direction of the stem 1.

Figure 4:
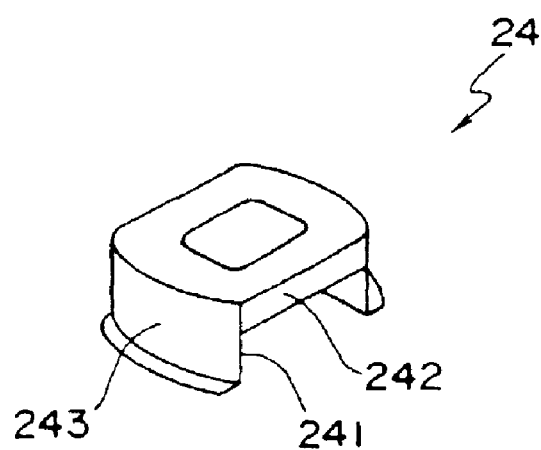
FIG. 4 is a view showing a cap in another embodiment.

FIG. 4 is a view showing a cap 24 in another embodiment. Since the cap 24 of the present embodiment has a configuration identical to that of the cap 4 of FIG. 1 except that a reinforcing plate portion 242 is provided, description will be made of the semiconductor laser device with reference to FIG. 1 as a substitution. The cap 24 has a reinforcing plate portion 242 with a height of 0.5 mm to 1 mm upward of a lateral aperture 241. The reinforcing plate portion 242 imparts stiffness larger than that of the cap 4 of FIG. 1 to the cap 24 of the present embodiment. Accordingly, if the semiconductor laser device of the embodiment is used under the environment receiving vibration and impact, displacement is less likely to be generated between the holographic element 5 mounted on the cap 24 and the laser diode 2. Therefore, if the semiconductor laser device having the cap 24 is used in apparatuses receiving vibration and impact such as car navigation systems using DVD-ROM, a problem such as deviation of the optical axis of a laser beam will not be generated, thereby ensuring stable operation.

It is noted that if the reinforcing plate portion 242 has a height of less than 0.5 mm, the stiffness of the cap 4 against vibration becomes insufficient, while if the reinforcing plate portion 242 has a height of more than 1 mm, swift exchange of air between the inside and the outside of the cap 24 is prevented, resulting in decline of heat radiation efficiency of the semiconductor laser device.

Figure 5:
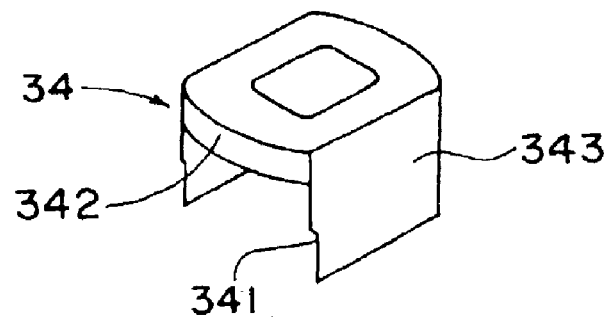
FIG. 5 is a view showing a cap in still another embodiment.

FIG. 5 is a view showing a cap 34 in still another embodiment. The cap 34 of the present embodiment, which has a configuration identical to the cap 14 of FIG. 3 except that a reinforcing plate portion 342 is provided, is mounted on the stem 1 of FIG. 1. The cap 34 of the present embodiment has a reinforcing plate portion 342 with a height of 0.5 mm to 1 mm upward of a lateral aperture 341 on both end portions of longer side direction. The reinforcing plate portion 342 imparts stiffness larger than that of the cap 14 of FIG. 3 to the cap 34 of the present embodiment. Accordingly, if the semiconductor laser device having the cap 34 is used under the environment receiving frequent vibration and impact, displacement is hardly generated between the holographic element mounted on the cap 34 and the stem 1 on which the cap 14 is mounted, which hardly causes a problem such as deviation of the optical axis of a laser beam. As a result, the semiconductor laser device having the cap 34 implements high reliability if used in the environment receiving vibration and impact such as car navigation systems using DVD-ROM. This makes it possible to improve performance of the navigation systems and the like with use of the semiconductor laser device.

Figure 6:
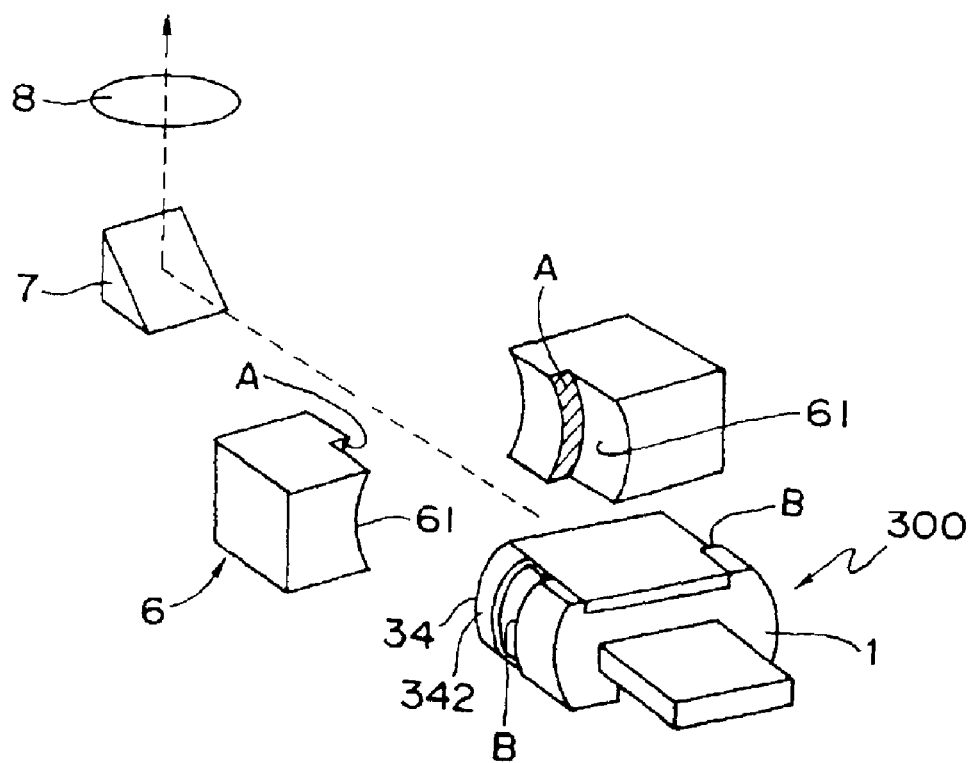
FIG. 6 is a view showing the process of mounting a semiconductor laser device having the cap of the embodiment of FIG. 5 on a support portion of a pickup unit.

FIG. 6 is a view showing part of a pickup unit with use of a semiconductor laser device 300 having a cap 34 of the embodiment shown in FIG. 5. The pickup unit is composed of a support portion 6 for supporting the semiconductor laser device 300, a mirror 7 for changing traveling direction of an outgoing beam from the semiconductor laser device 300, and an object lens 8 for converging a light beam from the mirror 7. The object lens 8 concentrates a laser beam on an unshown disk. The laser beam focused on the disk is reflected by the disk, and the reflected light comes into the semiconductor laser device 300 via the object lens 8 and the mirror 7, travels through the holographic element 5 (see FIG. 1), and is received by the light receiving element 3.

The support portion 6 for the semiconductor laser device 300 has concaves 61, 61 in which the outline of the both end portions of longer side direction of the stem 1 may be fitted, and has support end faces A, A formed perpendicular to the axis of the concave 61. The concave 61 has a curvature approximately identical to a curvature of the outline of the both end portions of longer side direction of the stem 1 in the semiconductor laser device. In the state that end faces B, B on the both end portions of longer side direction of the stem 1 in the semiconductor laser device 300 is in contact with the end face A, the semiconductor laser device 300 is rotated about the axis thereof, while the outline of the both end portions of longer side direction of the stem 1 is brought into contact with the concaves 61, 61. Thus, the mounting position of the semiconductor laser device 300 on the pickup unit is adjusted. When the mounting position of the semiconductor laser device 300 is determined, the semiconductor laser device 300 is attached to the support portion 6 with UV (ultraviolet) hardening resin.

Since the cap 34 of the semiconductor laser device 300 is mounted on the stem 1 by the lateral portions 343, 343 on the both end portions of shorter side direction, the end faces B, B of the stem 1 do not abut on, for example, the flange of the cap 34, and therefore has relatively large free area. Accordingly, when the semiconductor laser device 300 is rotated in the state of the end faces B, B having the large free area being in contact with the support end faces A, A, the rotation of the semiconductor laser device 300 may be stable. As a result, the semiconductor laser device 300 is free from deviation of the optical axis of a laser beam in adjustment of a mounting position, thereby enabling attachment to the support portion 6 with high accuracy.

Although in the above embodiments, the caps 4, 14, and 34 are fixed to the stem 1 by welding, they may be fixed with use of adhesives and the like.

Although in the above embodiment, the semiconductor laser device 300 is fixed to the support portion 6 with use of an UV hardening resin, it may be fixed to the support portion 6 with use of other adhesives.

Although the semiconductor laser devices of the above embodiments are used for car navigation systems using DVD-ROM, the semiconductor laser devices may be used in pickup units for other optical disks.

Although the semiconductor laser devices of the above embodiments have a light receiving element, the light receiving element may be omitted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device having a stem on which at least a laser diode is mounted, comprising:
   a cap which has an approximate portal shape having opposed lateral apertures and an emitting aperture, wherein the cap is welded or bonded to the stem; and
   a holographic element mounted on the cap.

2. The semiconductor laser device as defined in claim 1, wherein a reinforcing plate portion is provided, on an upper side of each of the lateral apertures of the cap.

3. The semiconductor laser device as defined in claim 1, wherein the cap is attached to the stem so that the lateral apertures face both end sides of longer side direction of the stem.

4. The semiconductor laser device as defined in claim 1, wherein
   the stem has arched protruding ridge portions on both ends of longer side direction thereof,
   the cap has flange portions on a lower end thereof, and
   the flange portions of the cap are welded or bonded to the ridge portions of the stem.

5. The semiconductor laser device as defined in claim 2, wherein
   the stem has flat portions which are disposed on both end portions of shorter side direction thereof and which extend to longer side direction thereof; and the cap has the lateral apertures and the reinforcing plate portions on both end portions of longer side direction thereof and has lateral plate portions on both end portions of shorter side direction thereof;

wherein the lateral plate portions of the cap are welded or bonded to the flat portions of the stem.

* * * * *